United States Patent
Ando et al.

(10) Patent No.: US 8,581,351 B2
(45) Date of Patent: Nov. 12, 2013

(54) REPLACEMENT GATE WITH REDUCED GATE LEAKAGE CURRENT

(75) Inventors: Takashi Ando, Tuckahoe, NY (US); Michael P. Chudzik, Danbury, CT (US); Rishikesh Krishnan, Poughkeepsie, NY (US); Siddarth A. Krishnan, Peekskill, NY (US); Unoh Kwon, Fishkill, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 13/006,656

(22) Filed: Jan. 14, 2011

(65) Prior Publication Data

US 2012/0181630 A1     Jul. 19, 2012

(51) Int. Cl.
*H01L 29/78*     (2006.01)

(52) U.S. Cl.
USPC ............ 257/410; 257/E29.255; 257/E21.409; 257/369; 257/411

(58) Field of Classification Search
USPC ........... 257/410, 369, 411, E29.255, E21.409
See application file for complete search history.

(56) References Cited

U.S. PATENT DOCUMENTS

| | | |
|---|---|---|
| 7,625,791 B2 | 12/2009 | Tseng et al. |
| 7,696,036 B2 | 4/2010 | Bu et al. |
| 7,696,517 B2 | 4/2010 | Luan et al. |
| 7,709,902 B2 | 5/2010 | Doris et al. |
| 7,732,872 B2 | 6/2010 | Cheng et al. |
| 7,754,594 B1 | 7/2010 | Chudzik et al. |
| 7,759,748 B2 | 7/2010 | Yu et al. |
| 2008/0191286 A1 | 8/2008 | Chang et al. |
| 2009/0152637 A1 | 6/2009 | Carter et al. |
| 2010/0052066 A1 | 3/2010 | Yu et al. |

OTHER PUBLICATIONS

Ando, T. et al., "Band-Edge High-Performance Metal-Gate/High-k nMOSFET Using Hf-Si/HfO2 Stack" IEEE Transactions on Electron Devices (2009) pp. 3223-3227, vol. 56(12).

*Primary Examiner* — Long Pham
(74) *Attorney, Agent, or Firm* — Scully, Scott, Murphy & Presser, P.C.; Joseph P. Abate, Esq.

(57) ABSTRACT

Replacement gate work function material stacks are provided, which provides a work function about the energy level of the conduction band of silicon. After removal of a disposable gate stack, a gate dielectric layer is formed in a gate cavity. A metallic compound layer including a metal and a non-metal element is deposited directly on the gate dielectric layer. At least one barrier layer and a conductive material layer is deposited and planarized to fill the gate cavity. The metallic compound layer includes a material having a work function about 4.4 eV or less, and can include a material selected from tantalum carbide and a hafnium-silicon alloy. Thus, the metallic compound layer can provide a work function that enhances the performance of an n-type field effect transistor employing a silicon channel.

20 Claims, 15 Drawing Sheets

REPLACEMENT GATE WITH REDUCED GATE LEAKAGE CURRENT

BACKGROUND

The present disclosure generally relates to semiconductor devices, and particularly to semiconductor structures having dual work function material gates and a high-k gate dielectric, and methods of manufacturing the same.

High gate leakage current of silicon oxide and nitrided silicon dioxide as well as depletion effect of polysilicon gate electrodes limits the performance of conventional semiconductor oxide based gate electrodes. High performance devices for an equivalent oxide thickness (EOT) less than 1 nm require high dielectric constant (high-k) gate dielectrics and metal gate electrodes to limit the gate leakage current and provide high on-currents. Materials for high-k gate dielectrics include $ZrO_2$, $HfO_2$, other dielectric metal oxides, alloys thereof, and their silicate alloys.

In general, dual metal gate complementary metal oxide semiconductor (CMOS) integration schemes employ two gate materials, one having a work function near the valence band edge of the semiconductor material in the channel and the other having a work function near the conduction band edge of the same semiconductor material. In CMOS devices having a silicon channel, a conductive material having a work function of 4.0 eV is necessary for p-type metal oxide semiconductor field effect transistors (NMOSFETs, or "NFETs") and another conductive material having a work function of 5.1 eV is necessary for n-type metal oxide semiconductor field effect transistors (PMOSFETs, or "PFETs"). In conventional CMOS devices employing polysilicon gate materials, a heavily p-doped polysilicon gate and a heavily n-doped polysilicon gate are employed to address the needs. In CMOS devices employing high-k gate dielectric materials, two types of gate stacks comprising suitable materials satisfying the work function requirements are needed for the PFETs and for the NFETS, in which the gate stack for the PFETs provides a flat band voltage closer to the valence band edge of the material of the channel of the PFETs, and the gate stack for the NFETs provides a flat band voltage closer to the conduction band edge of the material of the channel of the NFETs. In other words, threshold voltages need to be optimized differently between the PFETs and the NFETs.

A challenge in semiconductor technology has been to provide two types of gate electrodes having a first work function at or near the valence band edge and a second work function at or near the conduction band edge of the underlying semiconductor material such as silicon. This challenge has been particularly difficult because the two types of gate electrodes are also required to be a metallic material having a high electrical conductivity.

BRIEF SUMMARY

Replacement gate work function material stacks are provided, which provide a work function about the energy level of the conduction band of silicon. After removal of a disposable gate stack, a gate dielectric layer is formed in a gate cavity. A metallic compound layer including a metal and a non-metal element is deposited directly on the gate dielectric layer. At least one barrier layer and a conductive material layer are deposited and planarized to fill the gate cavity. The metallic compound layer includes a material having a work function about 4.0 eV, and specifically, less than 4.4 eV, and can include a material selected from tantalum carbide and a hafnium-silicon alloy. Thus, the metallic compound layer can provide a work function that enhances the performance of an n-type field effect transistor employing a silicon channel.

According to an aspect of the present disclosure, a semiconductor structure including a field effect transistor is provided. The field effect transistor includes a gate stack including: a gate dielectric located on a semiconductor substrate; a work function metallic compound portion including a metal and a non-metal element, having a work function not greater than 4.4 eV, and contacting the gate dielectric; and a conductive metal portion located on the work function metallic compound portion.

According to another aspect of the present disclosure, a method of forming a semiconductor structure including a field effect transistor is provided. The method includes: forming a material layer stack, from bottom to top, including at least a gate dielectric layer, a work function metallic compound layer including a metal and a non-metal element and having a work function not greater than 4.4 eV, and a conductive metal layer on a semiconductor substrate; and forming a gate stack by removing portions of the material layer stack from above a source region and a drain region of a field effect transistor, wherein the gate stack overlies a channel region of the field effect transistor.

DETAILED DESCRIPTION

Figure 1:
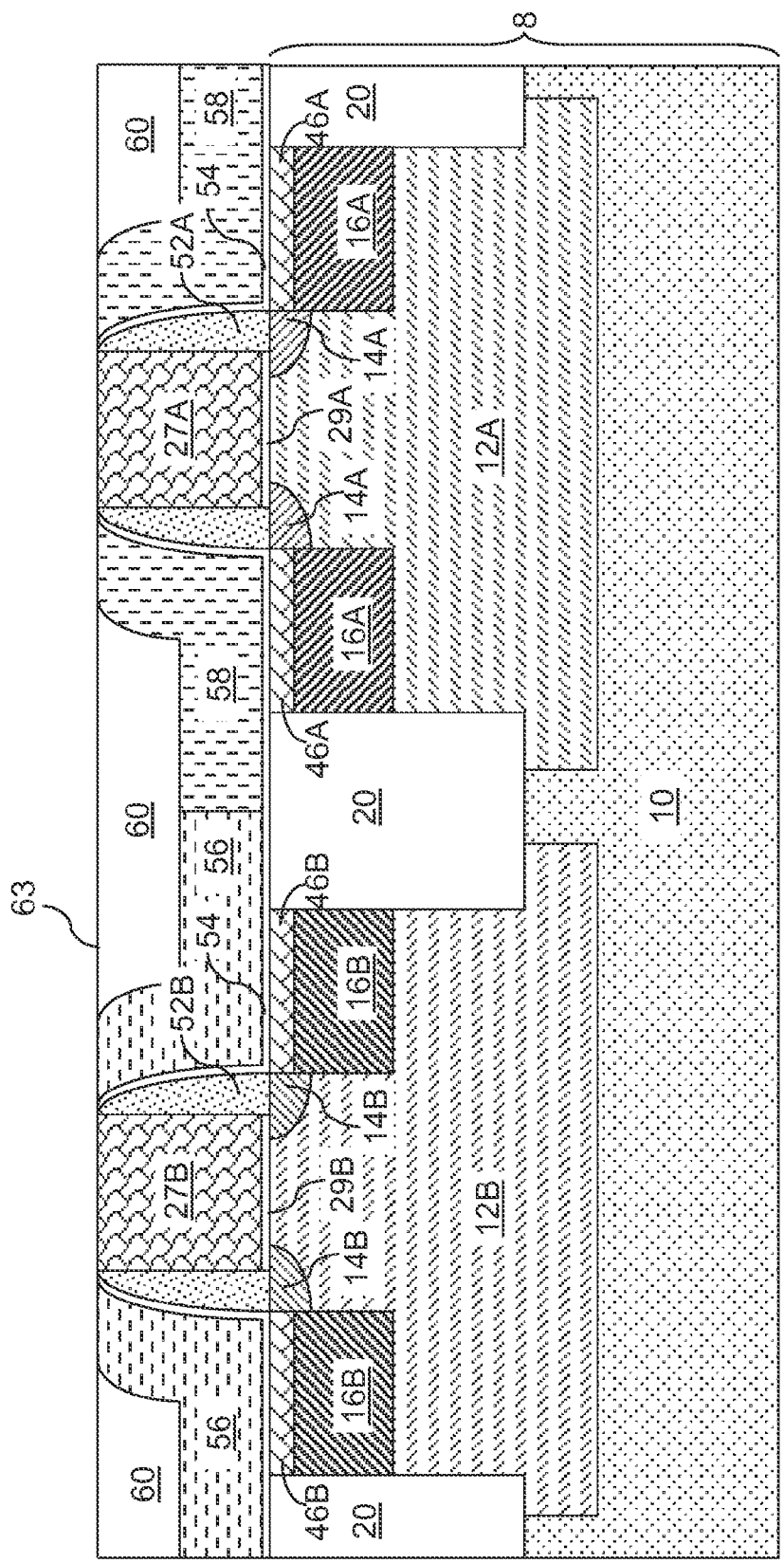
FIG. 1 is vertical cross-sectional view of a first exemplary semiconductor structure after formation of disposable gate structures and formation of a planar dielectric surface on a planarization dielectric layer according to an embodiment of the present disclosure.

As stated above, the present disclosure relates to semiconductor structures having dual work function material gates and a high-k gate dielectric, and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to a first embodiment of the present disclosure includes a semiconductor substrate 8, on which various components of field effect transistors are formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of n-type or p-type at different dopant concentration levels. For example, the semiconductor substrate 8 may include an underlying semiconductor layer 10, a p-type well 12A formed in a first device region (the region to the left in FIG. 1), and an n-type well 12B formed in a second device region (the region to the right in FIG. 1). The n-type well 12B is doped with n-type electrical dopants. The p-type well 12A is doped with p-type electrical dopants.

Shallow trench isolation structures 20 are formed to laterally separate each of the n-type well 12B and the p-type well 12A. Typically, each of the n-type well 12B and the p-type well 12A is laterally surrounded by a contiguous portion of the shallow trench isolation structures 20. If the semiconductor substrate 8 is a semiconductor-on-insulator substrate, bottom surfaces of the n-type well 12B and the p-type well 12A may contact a buried insulator layer (not shown), which electrically isolates each of the n-type well 12B and the p-type well 12A from other semiconductor portions of the semiconductor substrate 8 in conjunction with the shallow trench isolation structures 20.

A disposable dielectric layer and a disposable gate material layer are deposited and lithographically patterned to form disposable gate structures. For example, the disposable gate stacks may include a first disposable gate structure that is a stack of a first disposable dielectric portion 29A and a first disposable gate material portion 27A and a second disposable gate structure that is a stack of a second disposable dielectric portion 29B and a second disposable gate material portion 27B. The disposable dielectric layer includes a dielectric material such as a semiconductor oxide. The disposable gate material layer includes a material that can be subsequently removed selective to dielectric material such as a semiconductor material. The first disposable gate structure (29A, 27A) is formed over the p-type well 12A, and the second disposable gate structure (29B, 27B) is formed over the n-type well 12B. The height of the first disposable gate structure (29A, 27A) and the second disposable gate structure (29B, 27B) can be from 20 nm to 500 nm, and typically from 40 nm to 250 nm, although lesser and greater heights can also be employed.

N-type dopants are implanted into portions of the p-type well 12A that are not covered by the first disposable gate structure (29A, 27A) to form n-type source and drain extension regions 14A. The n-type well 12B can be masked by a photoresist (not shown) during the implantation of the n-type dopants to prevent implantation of the n-type dopants therein. Similarly, p-type dopants are implanted into portions of the n-type well 12B that are not covered by the second disposable gate structure (29B, 27B) to form p-type source and drain extension regions 14B. The p-type well 12A can be masked by a photoresist (not shown) during the implantation of the p-type dopants to prevent implantation of the p-type dopants therein.

Dielectric gate spacers are formed on sidewalls of each of the disposable gate structures, for example, by deposition of a conformal dielectric material layer and an anisotropic etch. The dielectric gate spacers include a first dielectric gate spacer 52A formed around the first disposable gate structure (29A, 27A) and a second dielectric gate spacer 52B formed around the second disposable gate structure (29B, 27B).

Dopants of the n-type are implanted into portions of the p-type well 12A that are not covered by the first disposable gate structure (29A, 27A) and the first dielectric gate spacer 52A to form n-type source and drain regions 16A. The n-type well 12B can be masked by a photoresist (not shown) during the implantation of the n-type dopants to prevent implantation of the n-type dopants therein. Similarly, dopants of the p-type are implanted into portions of the n-type well 12B that are not covered by the second disposable gate structure (29B, 27B) and the second dielectric gate spacer 52B to form p-type source and drain regions 16B. The p-type well 12A can be masked by a photoresist (not shown) during the implantation of the p-type dopants to prevent implantation of the p-type dopants therein.

In some embodiments, the n-type source and drain regions 16A and/or the p-type source and drain regions 16B can be formed by replacement of the semiconductor material in the p-type well 12A and/or the semiconductor material in the n-type well 12B with a new semiconductor material having a different lattice constant. In this case, the new semiconductor material(s) is/are typically epitaxially aligned with (a) single crystalline semiconductor material(s) of the p-type well 12A and/or the semiconductor material in the n-type well 12B, and apply/applies a compressive stress or a tensile stress to the semiconductor material of the p-type well 12A and/or the semiconductor material in the n-type well 12B between the n-type source and drain extension regions 14A and/or between the p-type source and drain extension regions 14B.

First metal semiconductor alloy portions 46A and second metal semiconductor alloy portions 46B are formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the metal semiconductor alloy portions (46A, 46B), which can include a metal silicide portions if the semiconductor material of the first and p-type source and drain regions (16A, 16B) include silicon.

Optionally, a dielectric liner 54 may be deposited over the metal semiconductor alloy portions 54, the first and second disposable gate structures (29A, 27A, 29B, 27B), and the first and second dielectric gate spacers (52A, 52B). A first stress-generating liner 58 and a second stress-generating liner 56 can be formed over the first disposable gate structure (29A, 27A) and the second disposable gate structure (29B, 27B), respectively. The first stress-generating liner 58 and the second stress-generating liner 56 can include a dielectric material that generates a compressive stress or a tensile stress to underlying structures, and can be silicon nitride layers deposited by plasma enhanced chemical vapor deposition under various plasma conditions.

A planarization dielectric layer 60 is deposited over the first stress-generating liner 58 and/or the second stress-generating liner 56, if present, or over the metal semiconductor alloy portions 54, the first and second disposable gate structures (29A, 27A, 29B, 27B), and the first and second dielectric gate spacers (52A, 52B) if (a) stress-generating liner(s) is/are not present. Preferably, the planarization dielectric layer 60 is a dielectric material that may be easily planarized. For example, the planarization dielectric layer 60 can be a doped silicate glass or an undoped silicate glass (silicon oxide).

The planarization dielectric layer 60, the first stress-generating liner 58 and/or the second stress-generating liner 56 (if present), and the dielectric liner 54 (if present) are planarized above the topmost surfaces of the first and second disposable gate structures (29A, 27A, 29B, 27B), i.e., above the topmost surfaces of the first and second disposable gate material portions (27A, 27B). The planarization can be performed, for example, by chemical mechanical planarization (CMP). The planar topmost surface of the planarization dielectric layer 60 is herein referred to as a planar dielectric surface 63.

The combination of the n-type source and drain extension regions 14A, the n-type source and drain regions 16A, and the p-type well 12A can be employed to subsequently form an n-type field effect transistor. The combination of the p-type source and drain extension regions 14B, the p-type source and drain regions 16B, and the n-type well 12B can be employed to subsequently form a p-type field effect transistor. The first stress-generating liner 58 can apply a tensile stress to the first channel, and the second stress-generating liner 56 can apply a compressive stress to the second channel.

Figure 2:
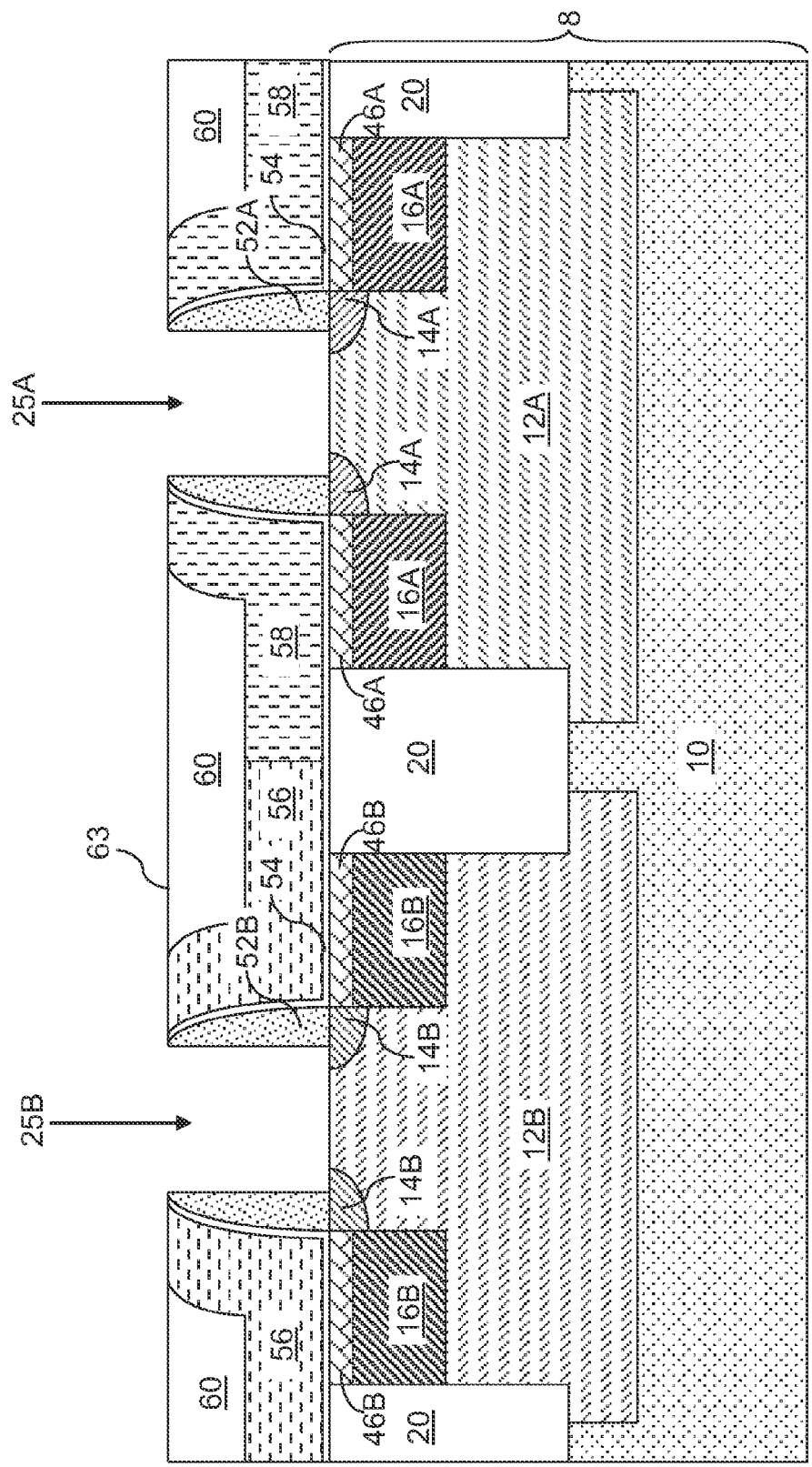
FIG. 2 is a vertical cross-sectional view of the first exemplary semiconductor structure of FIG. 1 after removal of the disposable gate structures.

Referring to FIG. 2, the first disposable gate structure (29A, 27A) and the second disposable gate structure (29B, 27B) are removed by at least one etch. The at least one etch can be a recess etch, which can be an isotropic etch or anisotropic etch. The etch employed to remove the first and second disposable gate material portions (27A, 27B) is preferably selective to the dielectric materials of the planarization dielectric layer 60, the first stress-generating liner 58 and/or the second stress-generating liner 56 (if present), and the first and second dielectric gate spacers (52A, 52B). Optionally, one or both of the dielectric portions (29A, 29B) can be left by etching selective to these layers. The disposable gate structures (29A, 27A, 29B, 27B) are recessed below the planar dielectric surface 63 to expose the semiconductor surfaces above the first channel and the second channel to form gate cavities (25A, 25B) over the semiconductor substrate.

Optionally, a first semiconductor-element-containing dielectric layer 31A can be formed on the exposed surface of the p-type well 12A by conversion of the exposed semiconductor material into a dielectric material, and a second semiconductor-element-containing dielectric layer 31B can be formed on the exposed surface of the n-type well 12B by conversion of the exposed semiconductor material into the dielectric material. The formation of the semiconductor-element-containing dielectric layers (31A, 31B) can be effected by thermal conversion or plasma treatment. If the semiconductor material of the p-type well 12A and the n-type well 12B includes silicon, the semiconductor-element-containing dielectric layers (31A, 31B) can include silicon oxide or silicon nitride. The semiconductor-element-containing dielectric layers (31A, 31B) are interfacial dielectric layers that contact a semiconductor surface underneath and gate dielectrics to be subsequently deposited thereupon.

Figure 3:
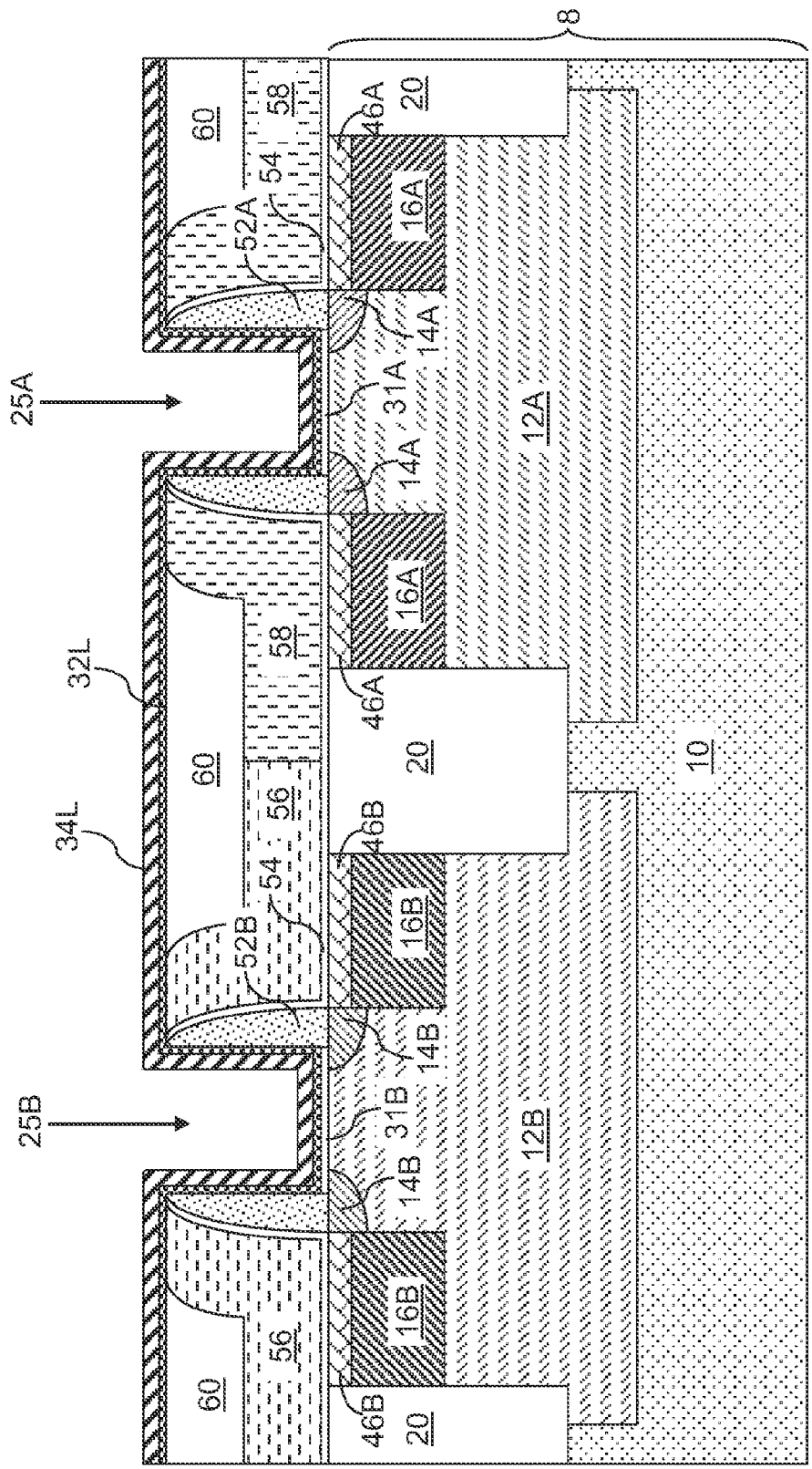
FIG. 3 is a vertical cross-sectional view of the first exemplary semiconductor structure of FIG. 2 after formation of a work function metal compound layer.

Referring to FIG. 3, a contiguous gate dielectric layer 32L and a work function metallic compound layer 34L including a first metal having a first work function are sequentially deposited to form a stack, from bottom to top, of the contiguous gate dielectric layer 32L and the work function metallic compound layer 34L. The contiguous gate dielectric layer 32L can be a high dielectric constant (high-k) material layer having a dielectric constant greater than 8.0. The contiguous gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the contiguous gate dielectric layer 32L, as measured at horizontal portions, can be from 0.9 nm to 6 nm, and preferably from 1.0 nm to 3 nm. The high-k material layer 32L may have an effective oxide thickness on the order of or less than 1 nm. In one embodiment, the contiguous gate dielectric layer 32L is a hafnium oxide ($HfO_2$) layer.

The work function metallic compound layer 34L includes a metallic compound, which includes a metal and a non-metal element. The metallic compound is selected to optimize the performance of an n-type field effect transistor to be subsequently formed employing the n-type source and drain extension regions 14A, the n-type source and drain regions 16A, and the p-type well 12A. Specifically, the metallic compound has a first work function, which is not greater than 4.4 eV. Typically, the metallic compound is selected from a material having a work function not less than 3.9 eV and not greater than 4.4 eV.

In one embodiment, the metallic compound of a metal and a non-metallic element is selected from a metallic compound that does not include nitrogen so that the work function of the metallic compound is closer to the conduction band gap edge of silicon than to the valence band gap edge of silicon. For example, the metallic compound can be selected from tantalum carbide (TaC) and a hafnium-silicon (HfSi) alloy. Tantalum carbide or a hafnium-silicon alloy provides a first work function between 4.0 eV and 4.4 eV, i.e., a first work function that is significantly greater than the mid-band-gap energy of 4.55 eV for silicon.

The work function metallic compound layer 34L can be formed, for example, by physical vapor deposition, chemical vapor deposition, or atomic layer deposition (ALD). The thickness of the work function metallic compound layer 34L is typically set at a value from 1 nm to 30 nm, and more typically, from 2 nm to 10 nm, although lesser and greater thicknesses can also be employed.

Figure 4:
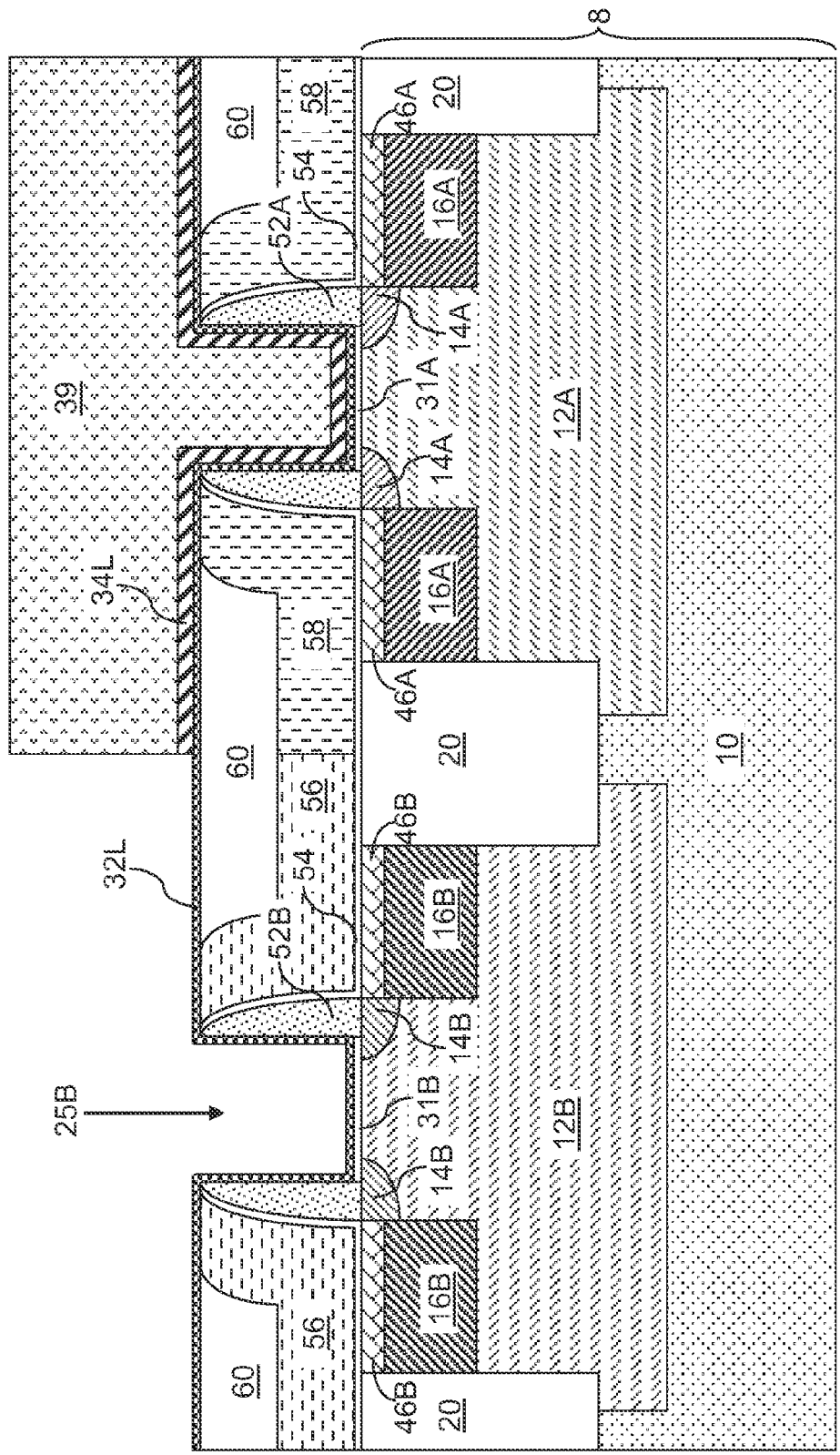
FIG. 4 is a vertical cross-sectional view of the first exemplary semiconductor structure of FIG. 3 after application of a photoresist and lithographic patterning of the work function metal compound layer.

Referring to FIG. 4, a first photoresist 39 is applied and lithographic patterned so that the first photoresist 39 covers the area over the p-type well 12A, while the top surface of the work function metallic compound layer 34L is exposed over the n-type well 12B. The pattern in the first photoresist 39 is transferred into the work function metallic compound layer 34L by an etch. The portion of the work function metallic compound layer 34L within the second gate cavity 25B is removed employing the first photoresist 39 as an etch mask. The first photoresist 39 is removed, for example, by ashing or wet etching. After the patterning of the work function metallic compound layer 34L, a remaining portion of the work function metallic compound layer 34L is present in the first device region and not present in the second device region. Correspondingly, the work function metallic compound layer 34L is present in the first gate cavity 25A (See FIG. 3), but is not present in the second gate cavity 25B.

Figure 5:
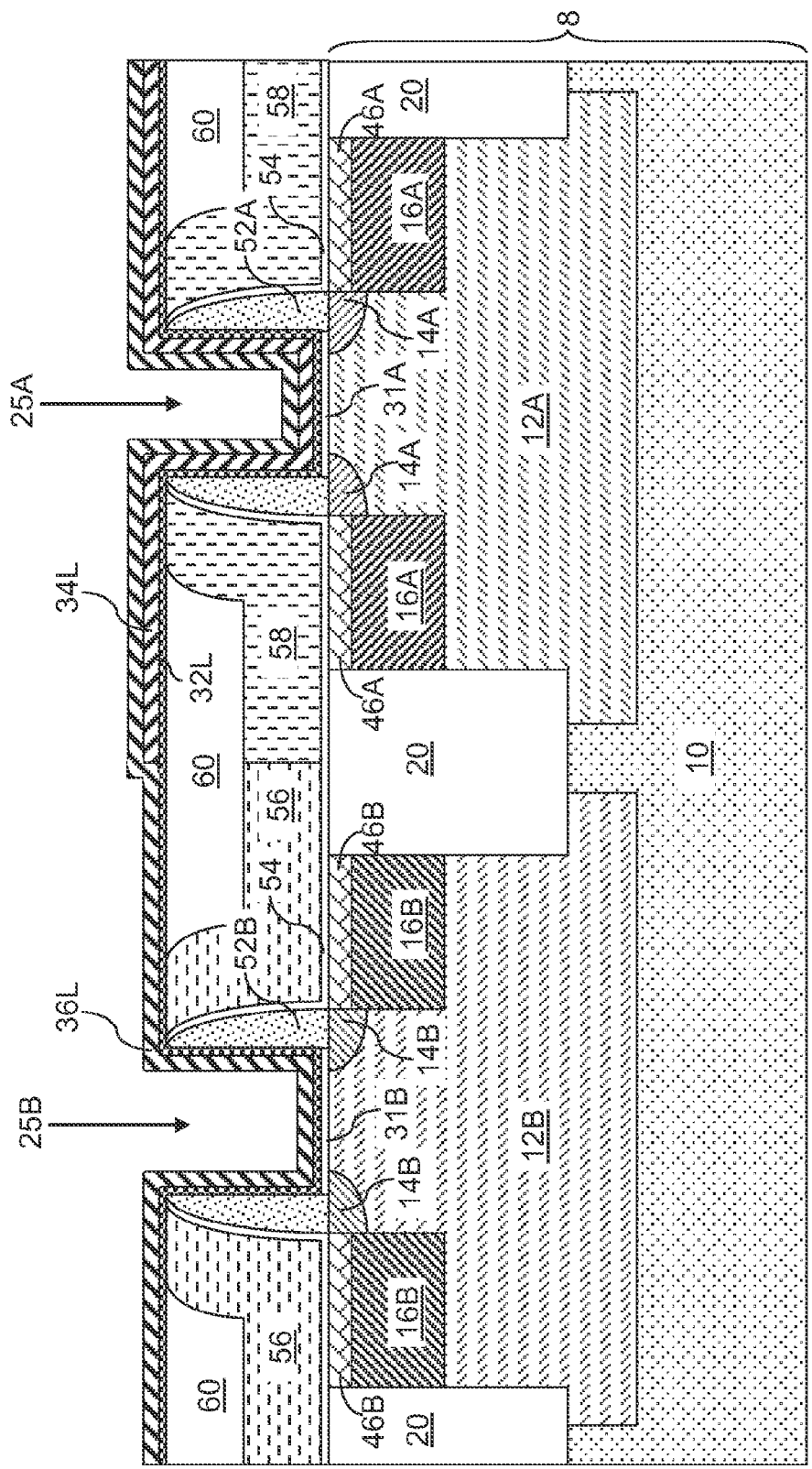
FIG. 5 is a vertical cross-sectional view of the first exemplary semiconductor structure of FIG. 4 after removal of the photoresist and formation of a p-type work function material layer.

Referring to FIG. 5, a p-type work function material layer 36L is deposited. The p-type work function material layer 36L includes a second metal having a second work function, which is different from the first work function. Specifically, the second work function is not less than 4.55 eV, and can be closer to the valence band edge of silicon than to the conduction band edge of silicon. The material of the p-type work function material layer 36L is selected to optimize the performance of a p-type field effect transistor to be subsequently formed employing the p-type source and drain extension regions 14B, the p-type source and drain regions 16B, and the n-type well 12B.

The material of the p-type work function material layer 36L can include a metallic nitride. In one embodiment, the p-type work function material layer 36L can include a silicon valence band edge material such as Pt, Rh, Ir, Ru, Cu, Os, Be, Co, Pd, Te, Cr, Ni, TiN, and alloys thereof. For example, the p-type work function material layer 36L can be a layer of TiN. A silicon valence band edge material is a material having a work function that is closer to the valence band edge of silicon than to the conduction band edge of silicon.

The p-type work function material layer 36L can be formed, for example, by physical vapor deposition, chemical vapor deposition, or atomic layer deposition (ALD). The thickness of the p-type work function material layer 34L is typically set at a value from 2 nm to 100 nm, and more typically, from 3 nm to 10 nm, although lesser and greater thicknesses can also be employed.

Figure 6:
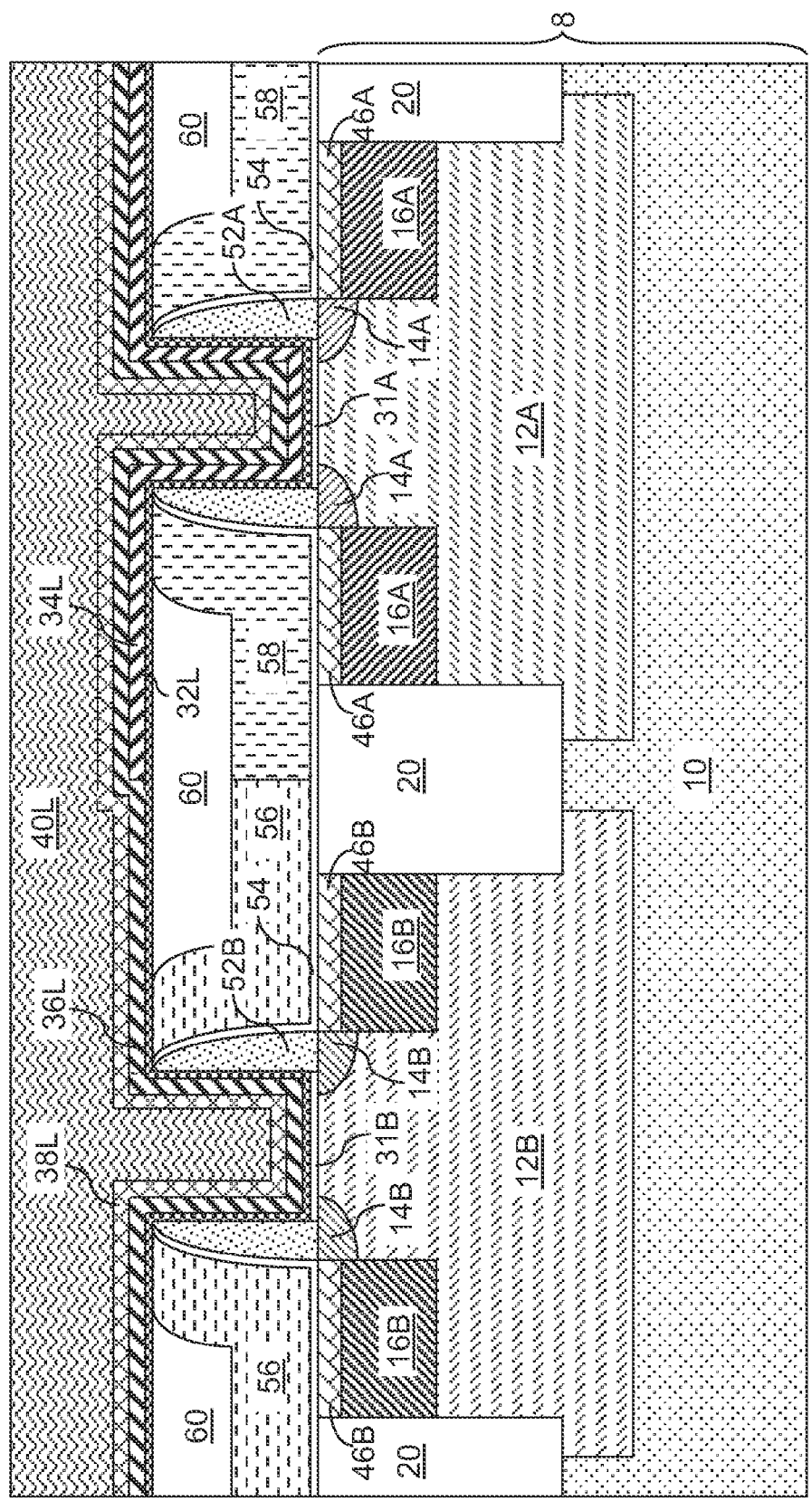
FIG. 6 is a vertical cross-sectional view of the first exemplary semiconductor structure of FIG. 5 after deposition of at least one metallic barrier layer and a conductive metal layer.

Referring to FIG. 6, an optional barrier metal layer 38L can deposited on the p-type work function material layer 36L. In a non-limiting illustrative example, the optional barrier metal layer 38L can include a tantalum nitride layer, a titanium nitride layer, a titanium-aluminum alloy, or a combination thereof. The thickness of the optional barrier metal layer 38L can be from 0.5 nm to 20 nm, although lesser and greater thicknesses can also be employed. The optional barrier metal layer 38L may be omitted in some embodiments. In one embodiment, the optional barrier metal layer 38L includes a metallic nitride. For example, the optional barrier metal layer 38L can include titanium nitride.

A conductive metal layer 40L can be deposited on the optional barrier metal layer 38L or on the p-type work function material layer 36L. The conductive metal layer 40L can include a conductive material deposited by physical vapor deposition or chemical vapor deposition. For example, the conductive metal layer 40L can be an aluminum layer or an aluminum alloy layer deposited by physical vapor deposition. The thickness of the conductive metal layer 40L, as measured in a planar region of the conductive metal layer 40L above the top surface of the planarization dielectric layer 60, can be from 100 nm to 500 nm, although lesser and greater thicknesses can also be employed. In one embodiment, the conductive metal layer 40 consists essentially of a single elemental metal such as Al, Au, Ag, Cu, or W. For example, the conductive metal layer can consist essentially of aluminum.

At the end of the processing step of FIG. 6, a material layer stack is formed, which includes, from bottom to top, the contiguous gate dielectric layer 32L which is a gate dielectric layer, the work function metallic compound layer 34L, the p-type work function material layer 36L, and the conductive metal layer 40L. The portion of the material layer stack in the first device region includes the work function metallic compound layer 34L and a portion of the p-type work function material layer 36L. The portion of the material layer stack in the second device region includes another portion of the p-type work function material layer 36L, but does not include any portion of the work function metallic compound layer 34L. The material layer stack is present over the top surface of the planarization dielectric layer 60 at this step.

Figure 7:
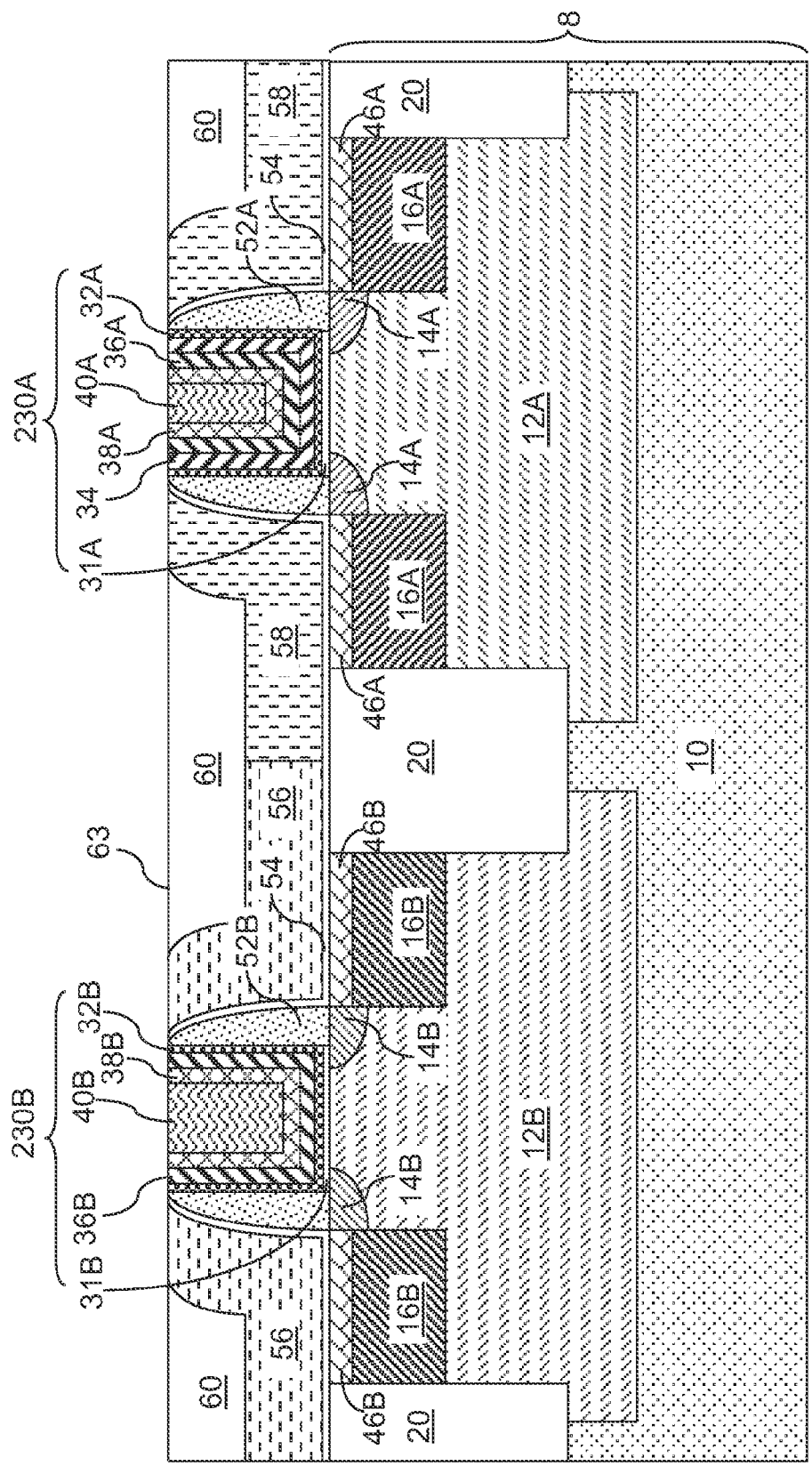
FIG. 7 is a vertical cross-sectional view of the first exemplary structure of FIG. 6 after planarization.

Referring to FIG. 7, portions of the gate conductor layer 40L, the optional barrier metal layer 38L, the p-type work function material layer 36L, the work function metallic compound layer 34L, and the contiguous gate dielectric layer 32L are removed from above the planar dielectric surface 63 of the planarization dielectric layer 60 by employing a planarization process. Replacement gate stacks are formed by removing portions of the material layer stack from above a source region and a drain region of each field effect transistor. The replacement gate stacks include a first replacement gate stack 230A located in the first device region and a second replacement gate stack 230B located in the second device region. Each replacement gate stack (230A, 230B) overlies a channel region of a field effect transistor. The first replacement gate stack 230A and the second replacement gate stack 230B are formed concurrently.

An n-type field effect transistor is formed in the first device region. The n-type field effect transistor includes the p-type well 12A, the n-type source and drain extension regions 14A, the n-type source and drain regions 16A, first metal semiconductor alloy portions 46A, and a first replacement gate stack 230A. The first replacement gate stack 230A includes the optional first semiconductor-element-containing dielectric layer 31A, a first gate dielectric 32A which is a remaining portion of the contiguous gate dielectric layer 32L in the first device region, a work function metallic compound portion 34 which is a remaining portion of the work function metallic compound layer 34L, a metallic material portion 36A which is a remaining portion of the p-type work function material layer 36L in the first device region, a first optional barrier metal portion 38A which is a remaining portion of the optional barrier metal layer 38L, and a first gate conductor portion 40A which is a remaining portion of the gate conductor layer 40L.

A p-type field effect transistor is formed in the second device region. The second field effect transistor includes the n-type well 12B, the p-type source and drain extension regions 14B, the p-type source and drain regions 16B, a second metal semiconductor alloy portions 46B, and a second replacement gate stack 230B. The second replacement gate stack 230B includes the optional second semiconductor-element-containing dielectric layer 31B, a second gate dielectric 32B which is a remaining portion of the contiguous gate dielectric layer 32L in the second device region, a p-type work function material portion 36B which is a remaining portion of the p-type work function material layer 36L in the second device region, a second optional barrier metal portion 38B which is a remaining portion of the optional barrier metal layer 38L, and a second gate conductor portion 40B which is a remaining portion of the gate conductor layer 40L. The metallic material portion 36A in the first replacement gate stack 230A and the p-type work function material portion 36B in the second replacement gate stack 230B have the same material composition and the same thickness.

Each of the first and second gate dielectrics (32A, 32B) is a U-shaped gate dielectric, which includes a horizontal gate dielectric portion and a vertical gate dielectric portion extending upward from peripheral regions of the horizontal gate dielectric portion. In the n-type field effect transistor, the work function metallic compound portion 34 contacts inner sidewalls of the vertical gate dielectric portion of the first gate dielectric 32A. In the p-type field effect transistor, the p-type work function material portion 36B contacts inner sidewalls of the vertical gate dielectric portion of the second gate dielectric 32B.

Figure 8:
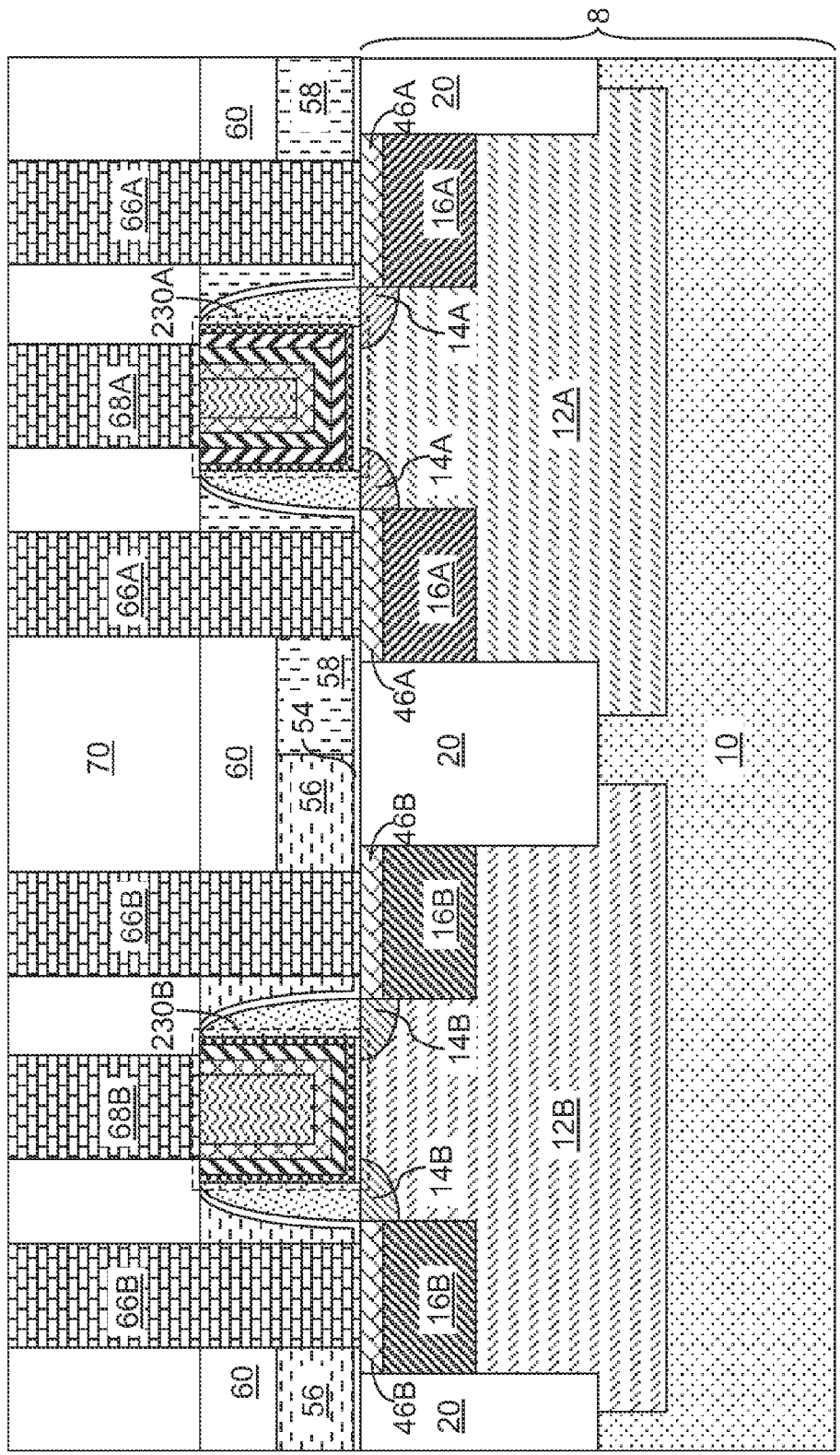
FIG. 8 is a vertical cross-sectional view of the first exemplary structure of FIG. 7 after formation of a contact-level dielectric layer and contact via structures.

Referring to FIG. 8, a contact-level dielectric layer 70 is deposited over the planarization dielectric layer 60. Various contact via structures can be formed, for example, by formation of contact via cavities by a combination of lithographic patterning and an anisotropic etch followed by deposition of a conductive material and planarization that removes an excess portion of the conductive material from above the contact-level dielectric layer 70. The various contact via structures can include, for example, first source/drain contact via structures 66A, second source/drain contact via structures 66B, a first gate contact via structure 68A, and a second gate contact via structure 68B.

Figure 9:
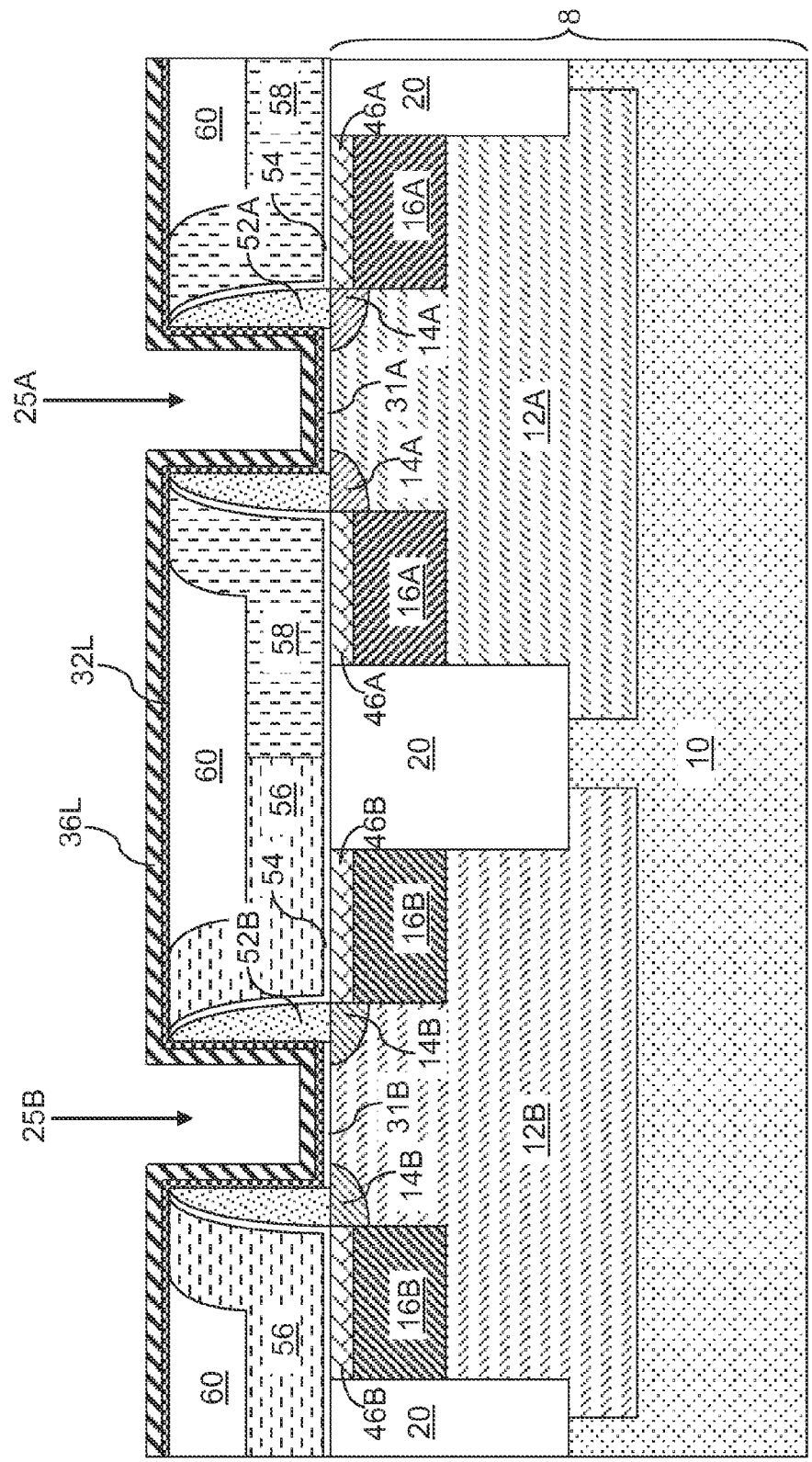
FIG. 9 is a vertical cross-sectional view of a second exemplary semiconductor structure after formation of a p-type work function material layer.

Referring to FIG. 9, a second exemplary semiconductor structure according to a second embodiment of the present disclosure is derived from the first exemplary semiconductor structure of FIG. 2 by depositing a contiguous gate dielectric layer 32L and a p-type work function material layer 36L. The contiguous gate dielectric layer 32L can have the same composition and thickness, and can be formed employing the same methods, as in the first embodiment. Further, the p-type work function material layer 36L can have the same composition and thickness, and can be formed employing the same methods, as in the first embodiment. Correspondingly, the p-type work function material layer 36L includes a material having a wok function, i.e., a second work function, not less than 4.55 eV.

Figure 10:
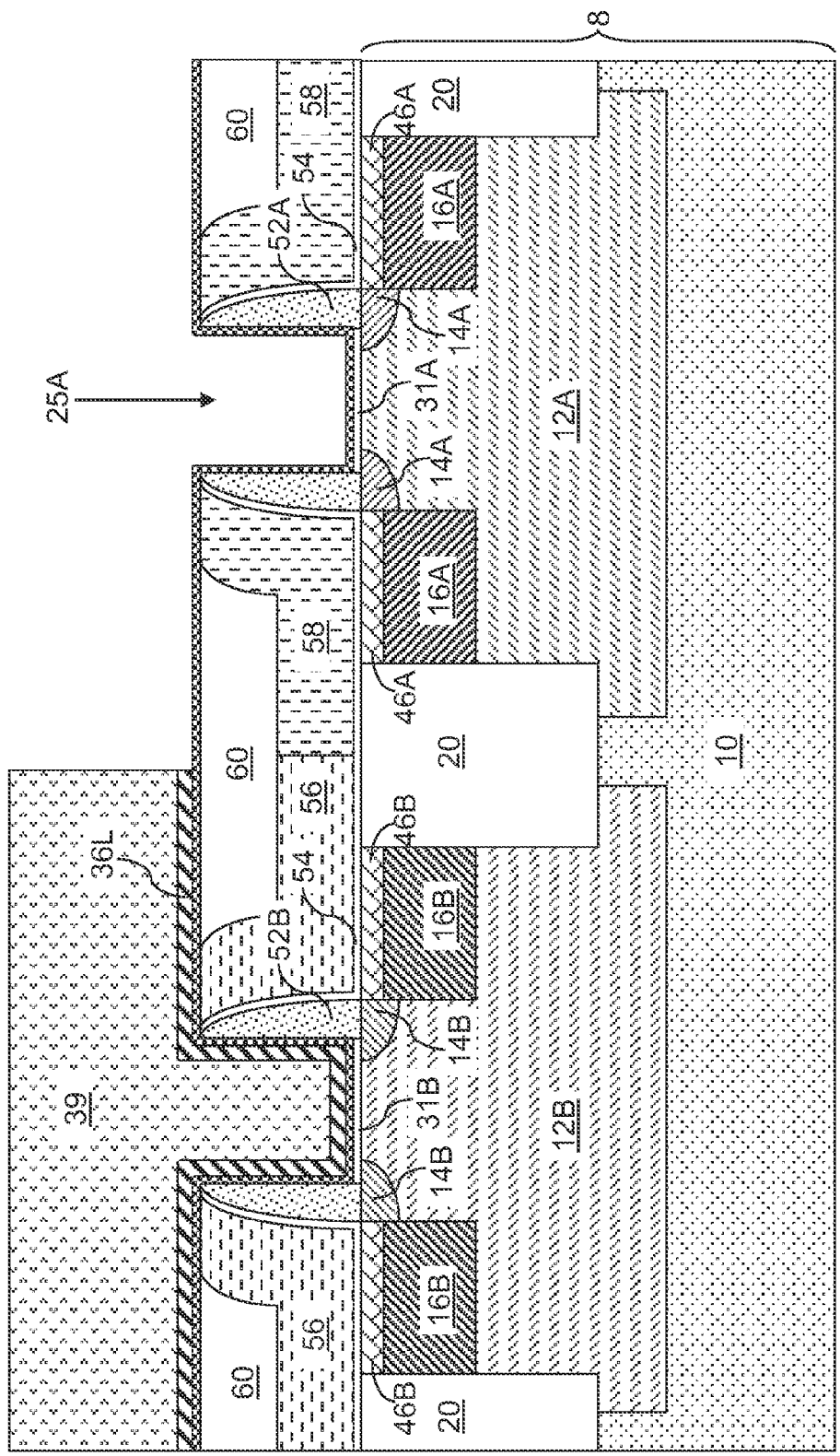
FIG. 10 is a vertical cross-sectional view of the second exemplary semiconductor structure of FIG. 9 after application of a photoresist and lithographic patterning of the p-type work function material layer.

Referring to FIG. 10, a first photoresist 39 is applied over the p-type work function material layer 36L and lithographically patterned. The p-type work function material layer 36L is patterned by an etch that transfers the pattern in the first photoresist 39 is transferred into the p-type work function material layer 36L. The portion of the p-type work function material layer 36L not covered by the first photoresist 39 is removed during the etch. Thus, a remaining portion of the p-type work function material layer 36L is present in a first device region, but is not present in a second device region. The first photoresist 39 is subsequently removed, for example, by ashing.

Figure 11:
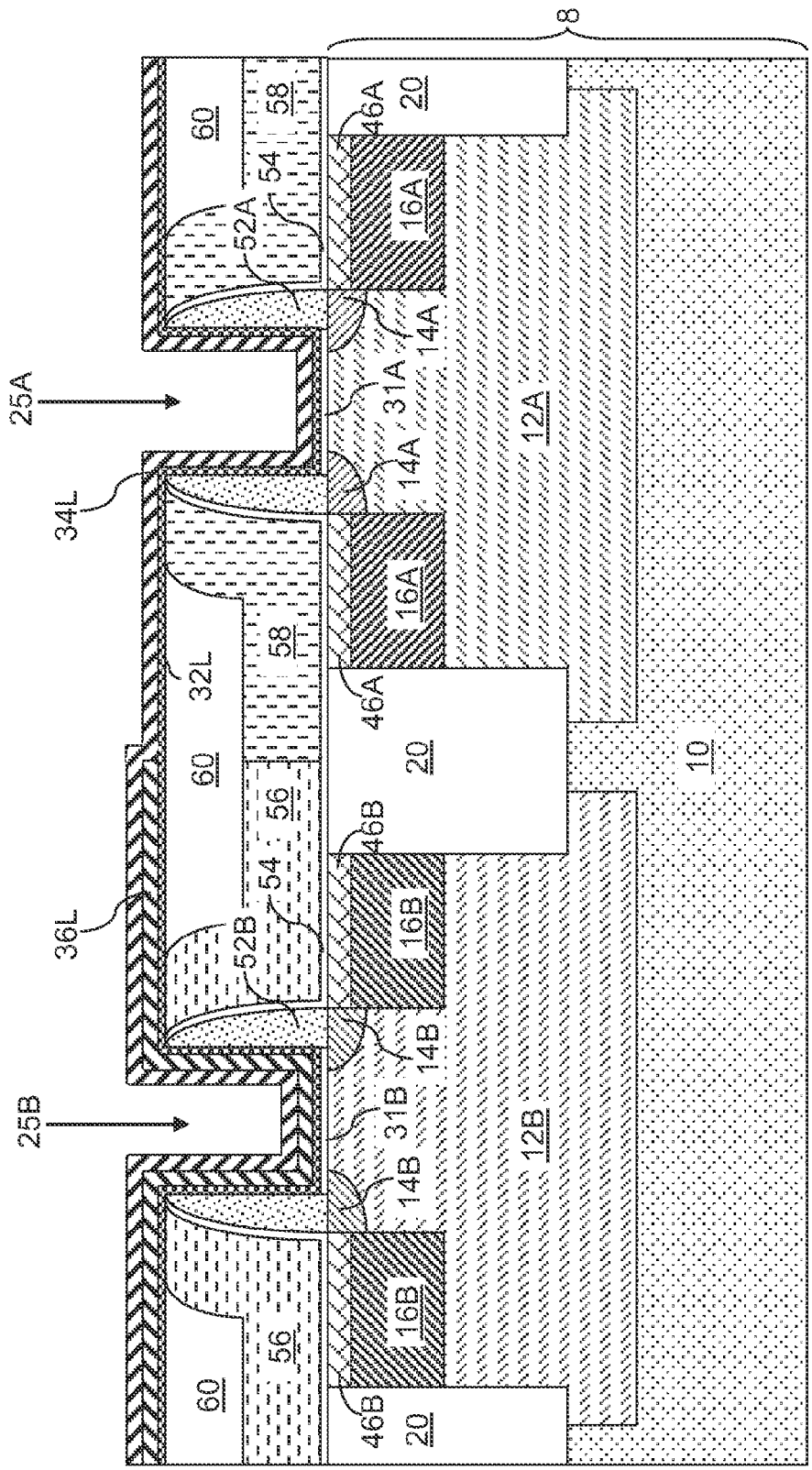
FIG. 11 is a vertical cross-sectional view of the second exemplary semiconductor structure of FIG. 10 after removal of the photoresist and formation of a work function metal compound layer.

Referring to FIG. 11, a work function metal compound layer 34L is as a blanket contiguous layer in the first and second regions including the first and second gate cavities (25A. 25B). The work function metal compound layer 34L can have the same composition and thickness, and can be formed by the same method, as in the first embodiment. Therefore, as in the first embodiment, the work function metallic compound layer 34L includes a metallic compound of a metal and a non-metal element. The metallic compound is selected to optimize the performance of an n-type field effect transistor to be subsequently formed employing the n-type source and drain extension regions 14A, the n-type source and drain regions 16A, and the p-type well 12A. The metallic compound has a first work function, which is not greater than 4.4 eV. Typically, the metallic compound is selected from a material having a work function not less than 3.9 eV and not greater than 4.4 eV.

In one embodiment, the metallic compound of a metal and a non-metallic element is selected from a metallic compound that does not include nitrogen so that the work function of the metallic compound is closer to the conduction band gap edge of silicon than to the valence band gap edge of silicon. For example, the metallic compound can be selected from tantalum carbide (TaC) and a hafnium-silicon (HfSi) alloy. Tantalum carbide or a hafnium-silicon alloy provides a first work function between 4.0 eV and 4.4 eV, i.e., a first work function that is significantly greater than the mid-band-gap energy of 4.55 eV for silicon.

Figure 12:
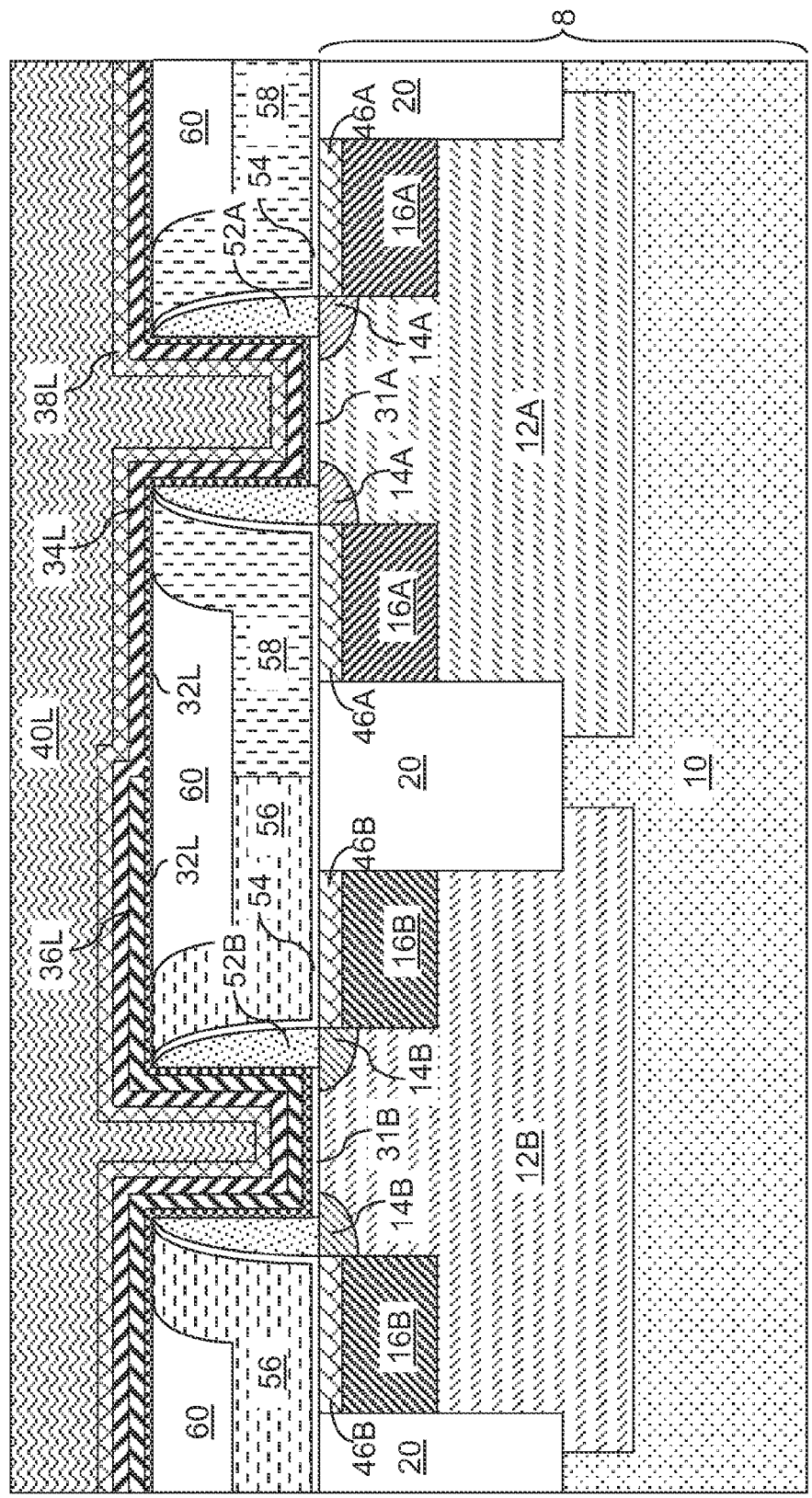
FIG. 12 is a vertical cross-sectional view of the second exemplary semiconductor structure of FIG. 11 after deposition of at least one metallic barrier layer and a conductive metal layer.

Referring to FIG. 12, an optional barrier metal layer 38L and conductive metal layer 40L can be deposited in the same manner as in the first embodiment. A material layer stack is formed, which includes, from bottom to top, the contiguous gate dielectric layer 32L which is a gate dielectric layer, the p-type work function material layer 36L, the work function metallic compound layer 34L, and the conductive metal layer 40L. The portion of the material layer stack in the first device region includes a portion of the work function metallic compound layer 34L but does not include any portion of the p-type work function material layer 36L. The portion of the material layer stack in the second device region includes the p-type work function material layer 36L and a portion of the work function metallic compound layer 34L. The material layer stack is present over the top surface of the planarization dielectric layer 60 at this step.

Figure 13:
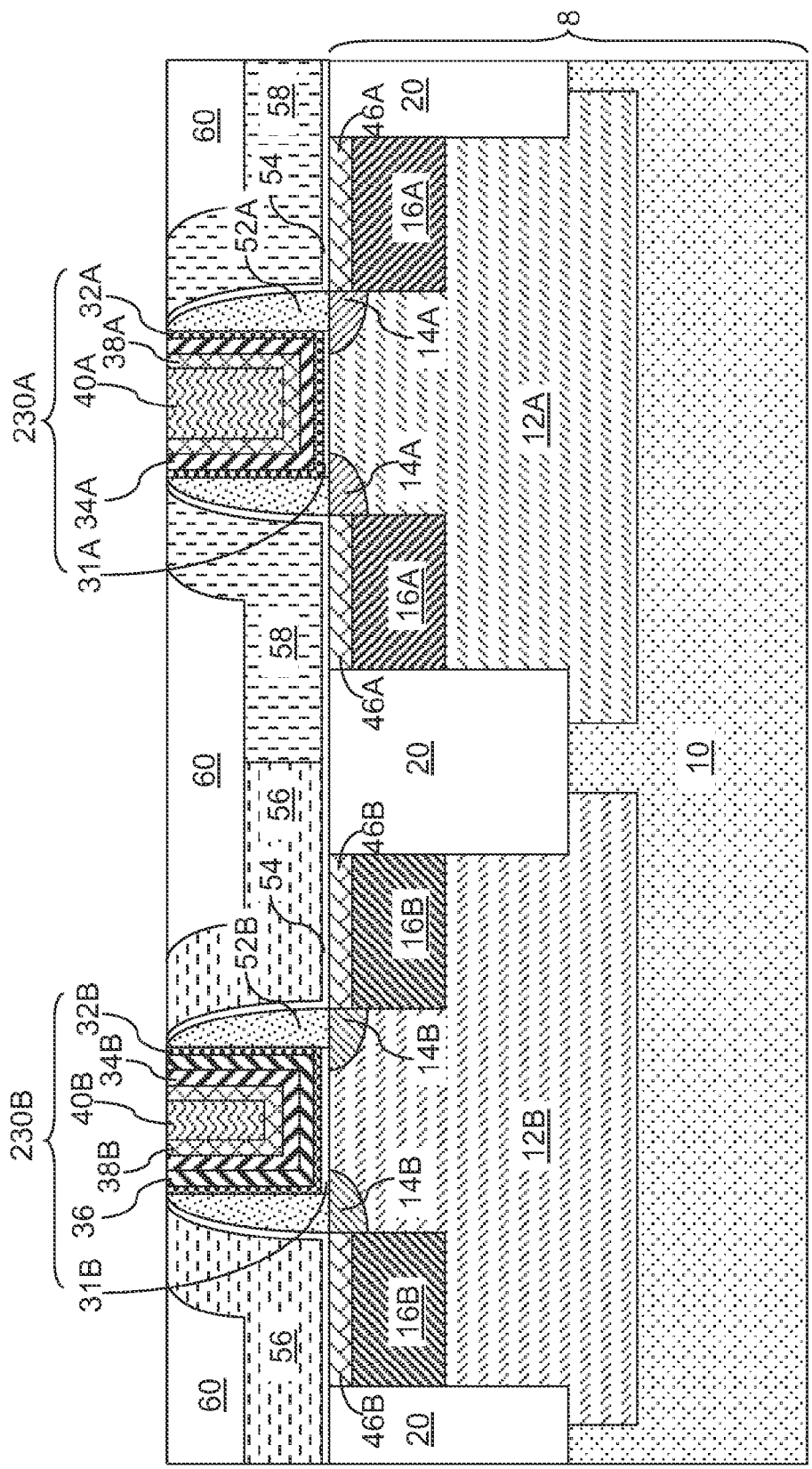
FIG. 13 is a vertical cross-sectional view of the second exemplary structure of FIG. 12 after planarization.

Referring to FIG. 13, portions of the gate conductor layer 40L, the optional barrier metal layer 38L, the work function metallic compound layer 34L, the p-type work function material layer 36L, and the contiguous gate dielectric layer 32L are removed from above the planar dielectric surface 63 of the planarization dielectric layer 60 by employing a planarization process. Replacement gate stacks are formed by removing portions of the material layer stack from above a source region and a drain region of each field effect transistor. The replacement gate stacks include a first replacement gate stack 230A located in the first device region and a second replacement gate stack 230B located in the second device region. Each replacement gate stack (230A, 230B) overlies a channel region of a field effect transistor. The first replacement gate stack 230A and the second replacement gate stack 230B are formed concurrently.

An n-type field effect transistor is formed in the first device region. The n-type field effect transistor includes the p-type well 12A, the n-type source and drain extension regions 14A, the n-type source and drain regions 16A, first metal semiconductor alloy portions 46A, and a first replacement gate stack 230A. The first replacement gate stack 230A includes the optional first semiconductor-element-containing dielectric layer 31A, a first gate dielectric 32A which is a remaining portion of the contiguous gate dielectric layer 32L in the first device region, a work function metallic compound portion 34A which is a remaining portion of the work function metallic compound layer 34L, a first optional barrier metal portion 38A which is a remaining portion of the optional barrier metal layer 38L, and a first gate conductor portion 40A which is a remaining portion of the gate conductor layer 40L.

A p-type field effect transistor is formed in the second device region. The second field effect transistor includes the n-type well 12B, the p-type source and drain extension regions 14B, the p-type source and drain regions 16B, a second metal semiconductor alloy portions 46B, and a second replacement gate stack 230B. The second replacement gate stack 230B includes the optional second semiconductor-element-containing dielectric layer 31B, a second gate dielectric 32B which is a remaining portion of the contiguous gate dielectric layer 32L in the second device region, a p-type work function material portion 36 which is a remaining portion of the p-type work function material layer 36L in the second device region, a metallic compound portion 34B which is a remaining portion of the work function metallic compound layer 34L, a second optional barrier metal portion 38B which is a remaining portion of the optional barrier metal layer 38L, and a second gate conductor portion 40B which is a remaining portion of the gate conductor layer 40L. The work function metallic compound portion 34A in the first replacement gate stack 230A and the metallic compound portion 34B in the second replacement gate stack 230B have the same material composition and the same thickness.

Each of the first and second gate dielectrics (32A, 32B) is a U-shaped gate dielectric, which includes a horizontal gate dielectric portion and a vertical gate dielectric portion extending upward from peripheral regions of the horizontal gate dielectric portion. In the n-type field effect transistor, the work function metallic compound portion 34A contacts inner sidewalls of the vertical gate dielectric portion of the first gate dielectric 32A. In the p-type field effect transistor, the p-type work function material portion 36 contacts inner sidewalls of the vertical gate dielectric portion of the second gate dielectric 32B.

Figure 14:
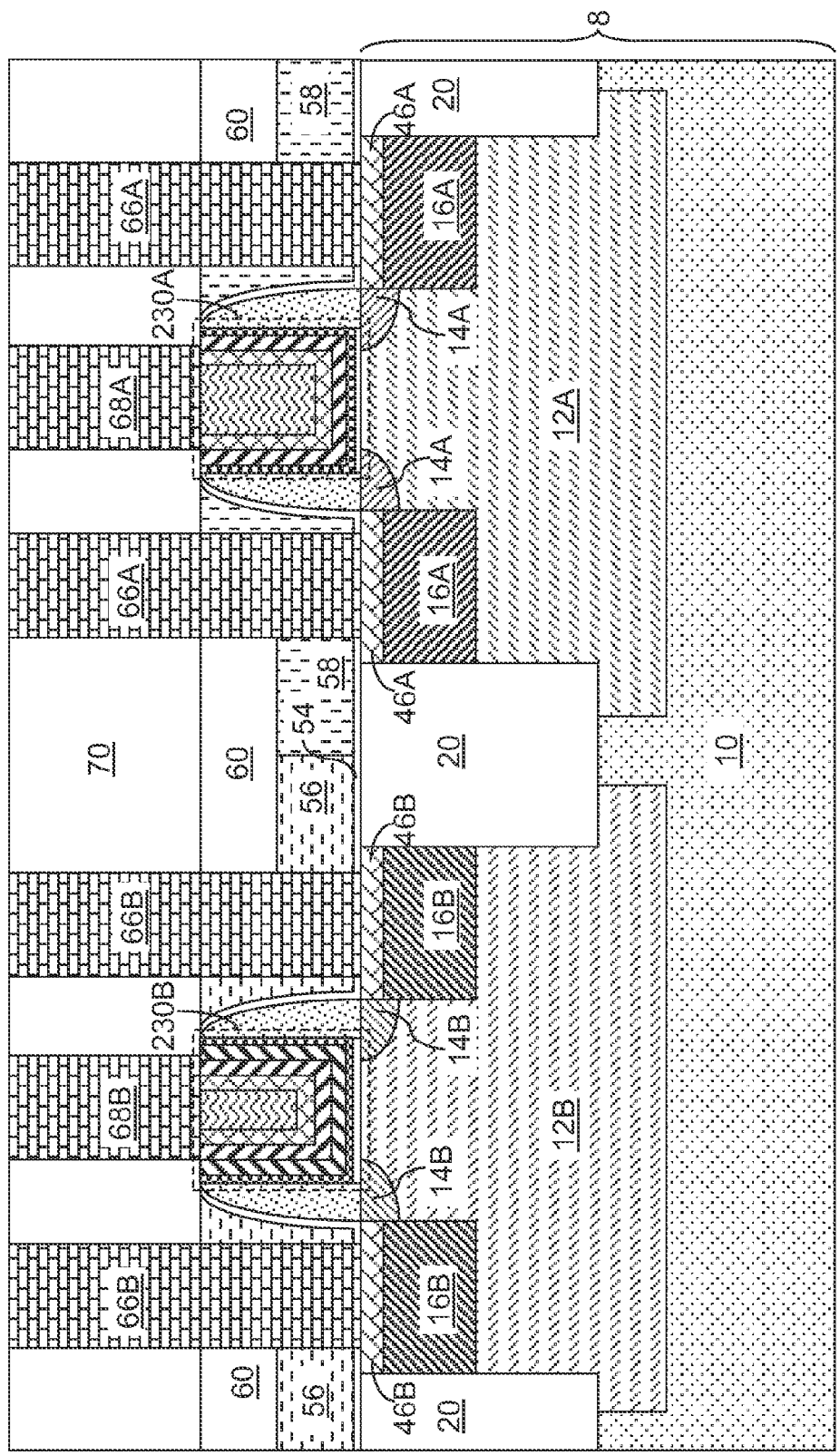
FIG. 14 is a vertical cross-sectional view of the second exemplary structure of FIG. 13 after formation of a contact-level dielectric layer and contact via structures.

Referring to FIG. 14, a contact-level dielectric layer 70 is deposited over the planarization dielectric layer 60. Various contact via structures can be formed, for example, by formation of contact via cavities by a combination of lithographic patterning and an anisotropic etch followed by deposition of a conductive material and planarization that removes an excess portion of the conductive material from above the contact-level dielectric layer 70. The various contact via structures can include, for example, first source/drain contact via structures 66A, second source/drain contact via structures 66B, a first gate contact via structure 68A, and a second gate contact via structure 68B.

Figure 15:
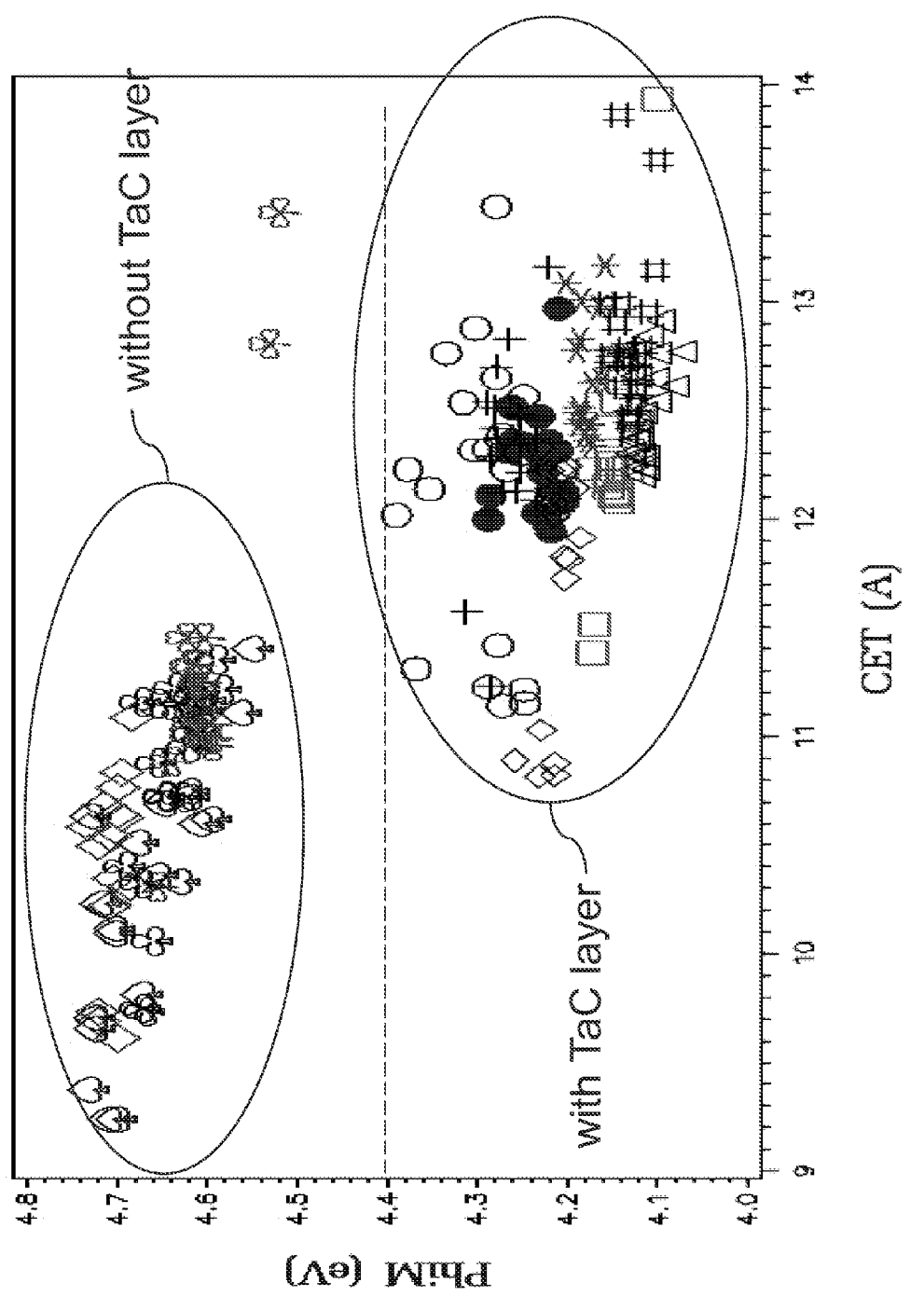
FIG. 15 is a graph illustrating data that shows the impact of the introduction of the work function metal compound portion.

Referring to FIG. 15, a graph illustrating data that shows the impact of the introduction of the work function metal compound portion (34 or 34A). The set of data points labeled as "with TaC layer" represents data from samples including a TaC layer as a work function metal compound portion (34 or 34A). The set of data points labeled as "without TaC layer" represents data from samples in which a work function metal compound portion (34 or 34A) is not present, and a TiN layer directly contacts a gate dielectric. The presence of a work function metal compound portion (34 or 34A) in an n-type field effect transistor has the effect of providing a work function between 4.0 eV and 4.4 eV, thereby matching the work function of gate electrodes for n-type field effect transistors close to a silicon band gap edge.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising a field effect transistor, said field effect transistor including a gate stack comprising:
    a gate dielectric located on a semiconductor substrate;
    a work function metallic compound portion including a metal and a non-metal element, having a work function not greater than 4.4 eV, and contacting said gate dielectric; and
    a conductive metal portion located on said work function metallic compound portion, wherein said field effect transistor further comprises a barrier metal portion contacting said work function metallic compound portion and said conductive metal portion.

2. The semiconductor structure of claim 1, wherein said work function metallic compound portion comprises a material selected from tantalum carbide and a hafnium-silicon alloy.

3. The semiconductor structure of claim 2, wherein said gate dielectric includes hafnium oxide.

4. The semiconductor structure of claim 1, wherein said work function metallic compound portion does not include nitrogen.

5. The semiconductor structure of claim 1, wherein said barrier metal portion comprises a metallic nitride, and said conductive metal portion consists essentially of a single elemental metal.

6. The semiconductor structure of claim 5, wherein said barrier metal portion comprises titanium nitride, and said conductive metal portion consists essentially of aluminum.

7. A semiconductor structure comprising a field effect transistor and another field effect transistor, said field effect transistor including a gate stack comprising:
    a gate dielectric located on a semiconductor substrate;
    a work function metallic compound portion including a metal and a non-metal element, having a work function not greater than 4.4 eV, and contacting said gate dielectric; and
    a conductive metal portion located on said work function metallic compound portion, and said other field effect transistor comprising:
    another gate dielectric comprising a same material, and having a same thickness, as said gate dielectric and located on said semiconductor substrate;
    a work function material portion including a material having a work function not less than 4.55 eV and contacting said other gate dielectric; and
    another conductive metal portion located on said work function material portion.

8. The semiconductor structure of claim 7, wherein said work function material portion comprises a metallic nitride.

9. The semiconductor structure of claim 7, wherein said field effect transistor further comprises a barrier metal portion contacting said work function metallic compound portion and said conductive metal portion, and said other field effect transistor further comprises another barrier metal portion comprising a same material as said barrier metal portion and contacting said work function material portion and said other conductive metal portion.

10. The semiconductor structure of claim 8, wherein said barrier metal portion and said other barrier metal portion comprise a metallic nitride.

11. The semiconductor structure of claim 7, wherein said field effect transistor comprises a metallic material portion comprising a same material as, and having a same thickness as, said work function material portion and contacting said work function metallic compound portion and not contacting said gate dielectric.

12. The semiconductor structure of claim 7, wherein said other field effect transistor comprises a metallic compound portion comprising a same material as, and having a same thickness as, said work function metallic compound portion and contacting said work function material portion and not contacting said other gate dielectric.

13. The semiconductor structure of claim 1, wherein said gate dielectric is a U-shaped gate dielectric having a dielectric constant greater than 8.0 and including a horizontal portion and a vertical portion extending above said horizontal portion.

14. A semiconductor structure comprising a field effect transistor, said field effect transistor including a gate stack comprising:
   a gate dielectric located on a semiconductor substrate;
   a work function metallic compound portion including a metal and a non-metal element, having a work function not greater than 4.4 eV, and contacting said gate dielectric; and
   a conductive metal portion located on said work function metallic compound portion, wherein said gate dielectric is a U-shaped gate dielectric having a dielectric constant greater than 8.0 and including a horizontal portion and a vertical portion extending above said horizontal portion, and wherein said work function metallic compound portion is U-shaped and contacts a top surface and an inner sidewall of said gate dielectric.

15. The semiconductor structure of claim 7, wherein said field effect transistor further comprises a barrier metal portion contacting said work function metallic compound portion and said conductive metal portion.

16. The semiconductor structure of claim 7, wherein said work function metallic compound portion comprises a material selected from tantalum carbide and a hafnium-silicon alloy.

17. The semiconductor structure of claim 16, wherein said gate dielectric includes hafnium oxide.

18. The semiconductor structure of claim 7, wherein said work function metallic compound portion does not include nitrogen.

19. The semiconductor structure of claim 14, wherein said field effect transistor further comprises a barrier metal portion contacting said work function metallic compound portion and said conductive metal portion.

20. The semiconductor structure of claim 19, wherein said barrier metal portion comprises a metallic nitride, and said conductive metal portion consists essentially of a single elemental metal.

\* \* \* \* \*